US007369666B2

(12) United States Patent
Tatsuta et al.

(10) Patent No.: US 7,369,666 B2
(45) Date of Patent: May 6, 2008

(54) AUDIO REPRODUCING SYSTEM

(75) Inventors: Kazuhito Tatsuta, Saitama (JP); Takami Maeda, Saitama (JP); Takeshi Sato, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 11/797,734

(22) Filed: May 7, 2007

(65) Prior Publication Data

US 2007/0206823 A1 Sep. 6, 2007

Related U.S. Application Data

(63) Continuation of application No. 10/201,971, filed on Jul. 25, 2002.

(30) Foreign Application Priority Data

Aug. 10, 2001 (JP) ........................ P 2001-244733

(51) Int. Cl.
*H04R 5/02* (2006.01)
*H04R 1/40* (2006.01)
*H04R 5/00* (2006.01)
*H03G 5/00* (2006.01)

(52) U.S. Cl. .......................... 381/302; 381/86; 381/97; 381/98; 381/307; 381/1; 381/18; 381/119; 381/27

(58) Field of Classification Search ................ 381/302, 381/1, 17, 18, 86, 119, 103, 307, 97, 98, 27
See application file for complete search history.

(56) References Cited

U.S. PATENT DOCUMENTS 4,219,696 A * 8/1980 Kogure et al. ................. 381/1
4,817,162 A * 3/1989 Kihara ........................ 381/97
5,068,897 A 11/1991 Yamato et al.
5,677,957 A * 10/1997 Hulsebus ...................... 381/1
5,872,851 A * 2/1999 Petroff ........................ 381/18
5,974,153 A * 10/1999 Cashion et al. ............... 381/11
6,016,473 A * 1/2000 Dolby ........................ 704/500
6,038,323 A 3/2000 Petroff
6,084,970 A * 7/2000 Aarts et al. .................. 381/17
6,842,524 B1 * 1/2005 Kobayashi ..................... 381/1

FOREIGN PATENT DOCUMENTS

EP 1 113 703 A1 7/2001
JP 10-210599 A 8/1998

* cited by examiner

*Primary Examiner*—Vivian Chin
*Assistant Examiner*—Devona E Faulk
(74) *Attorney, Agent, or Firm*—Sughrue Mion, PLLC

(57) ABSTRACT

High and low frequency components $C_{n1}$, $C_{n2}$ are generated by causing a center channel audio signal Cn to pass through a high-pass filter HPF and a low-pass filter LPF, and the high frequency component $C_{n1}$ is supplied to the center channel loudspeaker $SP_C$. Also, two low frequency components $C_{n2L}$, $C_{n2R}$, which have a different phase mutually, are generated by causing the low frequency component $C_{n2}$ to pass through phase shifters 2, 3. An synthesized audio signal SL is generated by synthesizing the low frequency component $C_{n2L}$ and the front-left channel audio signal FL, and then supplied to the front-left channel loudspeaker $SP_L$. An synthesized audio signal SR is generated by synthesizing the low frequency component $C_{n2R}$ and the front-right channel audio signal FR, and is supplied to the front-right channel loudspeaker $SP_R$.

4 Claims, 8 Drawing Sheets

AUDIO REPRODUCING SYSTEM

CROSS-REFERENCE TO RELATED APPLICATIONS

This is a continuation of application Ser. No. 10/201,971, filed on Jul. 25, 2002 in the United States Patent and Trademark Office. The entire disclosure of application Ser. No. 10/201,971 is hereby incorporated by reference.

BACKGROUND OF THE INVENTION

The present invention relates to an audio reproducing system for realizing a sound field with a reality sensation by correcting an interaural correlation for the listener.

In the related art, the multi-channel stereo system is known. This multi-channel stereo system intends to realize the sound field space with a reality sensation by supplying multi-channel audio signals to a plurality of loudspeakers to sound them.

For example, the multi-channel stereo system called the "5.1-channel system" is cited as the typical example. As shown in FIG. 7A, multi-channel audio signals FL, Cn, FR, LS, RS, LFE of 6 channels are power-amplified by the audio amplifiers $AMP_{FL}$, $AMP_{Cn}$, $AMP_{FR}$, $AMP_{LS}$, $AMP_{RS}$, $AMP_{LFE}$ respectively, and then supplied to the loudspeakers $SP_L$, $SP_C$, $SP_R$, $SPL_{Ls}$, $SP_{Rs}$, $SP_{SW}$ of independent 6 channels.

Then, as shown in FIG. 7B, the front-left loudspeaker $SP_L$, the center-channel loudspeaker $SP_C$ and the front-right loudspeaker $SP_R$ are arranged in front of the listener A, and the left surround loudspeaker $SP_{Ls}$ and the right surround loudspeaker $SP_{Rs}$ are arranged in the back of the listener A, and the heavy low sound reproducing loudspeaker $SP_{SW}$ called as the sub-woofer (referred to as the "sub-woofer" hereinafter) is arranged at the appropriate position.

Then, all the audio signals FL, Cn, FR, LS, RS of five channels except the sub-woofer channel audio signal LFE are set to cover the full range (about 20 Hz to about 20 kHz) of the audio frequency band. The sub-woofer channel audio signal LFE is set to cover the low frequency range of about 20 Hz to about 120 Hz.

In this manner, unlike the so-called "four-channel stereo system" in which only four loudspeakers $SP_L$, $SP_R$, $SP_{Ls}$, $SP_{Rs}$ arranged in front left, front right, rear left, and rear right sites are sounded, the "5.1-channel system" intends to realize the sound field space with the reality sensation by sounding the center loudspeaker $SP_c$ and the sub-woofer $SP_{SW}$ in addition to the above loudspeakers.

Also, the system that tends to realize the reality sensation that is identical to the "5.1-channel system" by utilizing few loudspeakers (referred to as the "pseudo system" hereinafter) is proposed.

In this pseudo system, as shown in FIG. 8A, the center-channel audio signal Cn based on the "5.1-channel system" is attenuated by the attenuator ATT, then the synthesized signal SL that is produced by synthesizing its attenuated signal Cn' to the left channel audio signal FL by virtue of the adder $ADD_{FL}$ is supplied to the front-left loudspeaker $SP_L$ via the audio amplifier $AMP_{FL}$, and then the synthesized signal SR that is produced by synthesizing its attenuated signal Cn' to the right-channel audio signal FR by virtue of the adder $ADD_{FR}$ is supplied to the front-right loudspeaker $SP_R$ via the audio amplifier $AMP_{FR}$.

In addition, the audio signals LFE, LS, RS based on the "5.1-channel system" are supplied to the sub-woofer $SP_{SW}$, the rear-left surround loudspeaker $SP_{Ls}$, and the rear-right surround loudspeaker $SP_{Rs}$ respectively.

Then, as shown in FIG. 8B, such pseudo system can provide the sound field that is able to give the reality sensation to the listener A, who is positioned in the almost center of four loudspeakers (so-called main loudspeakers) $SP_L$, $SP_R$, $SP_{Ls}$, $SP_{Rs}$ arranged in front left, front right, rear left, and rear right sites, not to provide the center-channel loudspeaker $SP_C$.

However, according to the above pseudo system in the prior art explained with reference to FIGS. 8A and 8B, if the position of the listener is deviated from the center position indicated by the symbol B in FIG. 8B, the phase differences are generated when the sound waves generated from respective loudspeakers $SP_L$, $SP_R$, $SP_{Ls}$, $SP_{Rs}$ come into both ears of the listener. Therefore, the listener is caused to feel the unnatural sound image, or the unclearness of the sound image normal and the dangling-about of the sound, etc. are generated. As a result, there is the problem that the reality sensation is considerably spoiled.

Also, in case the loudspeakers equipped in the above-mentioned compartment are sounded by the pseudo system, the center-channel audio signal Cn is reproduced via the front-left and front-right loudspeakers $SP_L$, $SP_R$ and thus the phase differences are generated when the regenerated sound waves reach both ears of the listener (the driver, or the like). Therefore, the listener is caused to feel the unnatural sound image normal, or the unclearness of the sound image normal and the dangling-about of the sound, etc. are generated. As a result, there is the problem that the reality sensation is considerably disturbed.

FIG. 2A shows the result of the influence of the phase difference in the sound waves that reach both ears of the driver (listener), which is measured quantitatively by using the binaural correlation coefficient $\rho_{LR}$ when the loudspeakers $SP_L$, $SP_R$, $SP_{Ls}$, $SP_{Rs}$, $SP_{SW}$ in the compartment are caused to sound based on the pseudo system.

According to this measured result, the binaural correlation coefficient $\rho_{LR}$ has the negative value in the range of about 200 Hz to about 600 Hz around about 400 Hz. This phenomenon signifies that the phase difference in the sound waves between both ears of the driver comes close to the opposite phase. It may be considered that this phenomenon causes the driver to feel the unnatural sound image normal or causes the unclearness of the sound image normal and the dangling-about of the sound, etc.

In addition, the range of about 200 Hz to about 600 Hz is used mainly as the vocal sound, the talk in the movie, etc. Therefore, there is the problem that the unclearness of the sound image normal and the dangling-about of the sound, etc. are generated. For instance, although essentially the driver hears the vocal sound (the speech of human beings, etc.) emitted from the front-left and front-right loudspeakers $SP_L$, $SP_R$ from the front side, such driver feels to hear the vocal sound from the back of the driver's head.

The invention is made in view of the problems in the prior art, and it is an object of the invention to provide an audio reproducing system for realizing the natural sound image normal, etc. by correcting the listener's interaural correlation of the audio signal.

In order to achieve the above object, there is provided an audio synthetic system including:

input section for inputting a first audio signal, a second audio signal and a third audio signal;

dividing section for dividing the third audio signal into two divided third signals, which have a phase difference mutually in one frequency range;

a first synthetic section for synthesizing one of the two divided third signals and the first audio signal into a first synthetic signal; and a second synthetic section for synthesizing the other of the two divided third signals and the second audio signal into a second synthetic signal.

Also, the audio synthetic system according to aspect 1, wherein the dividing section sets the phase difference of the one of the two divided third signals and the other of the two divided third signals to 180 degree at maximum in the one frequency range, which is from 200 Hz to 2 kHz, and adjusts the phase difference from 180 degree at maximum to 0 degree toward frequencies of 200 Hz and 2 kHz.

According to the audio reproducing system having such configuration, two center-channel audio signals that have a phase difference mutually are generated from the center-channel audio signal supplied from the sound source. Here, in order to fit to the vocal sound, etc., the phase difference is set −180 (deg) at maximum in the frequency range of 200 Hz to 2 kHz, and the phase difference is adjusted from −180 (deg) at maximum to 0 (deg) toward the frequencies of 200 Hz and 2 kHz. Then, the first synthesized audio signal, which is generating by synthesizing one center-channel audio signal being subjected to the phase adjustment and the front-left channel audio signal, is supplied to the front-left channel loudspeaker. Also, the second synthesized audio signal, which is generating by synthesizing the other center-channel audio signal being subjected to the phase adjustment and the front-right channel audio signal, is supplied to the front-right channel loudspeaker.

In this manner, the binaural correlation coefficient of the sound being output from both front channel loudspeakers is corrected by supplying the center channel audio signal having the phase difference to the front-left channel loudspeaker and the front-right channel loudspeaker, and the natural sound image normal, etc. can be realized, and thus the sound field with the reality sensation can be provided.

Also, in order to achieve the above object, there is provided an audio synthetic system including:

input section for inputting a first audio signal, a second audio signal and a third audio signal;

separating section for separating the third audio signal into a high frequency signal and a low frequency signal at a predetermined frequency as a boarder, and outputting the high frequency signal;

dividing section for dividing the low frequency signal into two divided low frequency signals, which have a phase difference mutually in one frequency range;

a first synthetic section for synthesizing one of the two divided low frequency signals and the first audio signal into a first synthetic signal; and a second synthetic section for synthesizing the other of the two divided low frequency signals and the second audio signal into a second synthetic signal.

Also, the audio synthetic system according to aspect 3, wherein the dividing section sets the phase difference of the one of the two divided low frequency signals and the other of the two divided low frequency signals to 180 degree at maximum in the one frequency range, which is from 200 Hz to 2 kHz, and adjusts the phase difference from 180 degree at maximum to 0 degree toward frequencies of 200 Hz and 2 kHz.

Also, the audio synthetic system according to aspect 4, wherein the separating section sets the predetermined frequency, from which the high frequency signal and the low frequency signal are separated, within a frequency range from a frequency, at which a phase is adjusted into 180 degree at maximum by the dividing section, to 2 kHz.

According to the audio reproducing system having such configuration, the predetermined high frequency component of the center channel audio signal is supplied to the center channel loudspeaker, the phase of the predetermined low frequency component of the center channel audio signal is adjusted, and the component is supplied to the front-left channel loudspeaker and the front-right channel loudspeaker. That is, two low frequency components that have a phase difference mutually in the predetermined frequency range are generated from the low frequency component. Then, the first synthesized audio signal, which is generating by synthesizing one low frequency component being subjected to the phase adjustment and the front-left channel audio signal, is supplied to the front-left channel loudspeaker. Also, the second synthesized audio signal, which is generating by synthesizing the other low frequency component being subjected to the phase adjustment and the front-right channel audio signal, is supplied to the front-right channel loudspeaker.

Here, in order to fit to the vocal sound, etc., the phase difference of two low frequency components is set −180 (deg) at maximum in the frequency range of 200 Hz to 2 kHz, and the phase difference is adjusted from −180 (deg) at maximum to 0 (deg) toward the frequencies of 200 Hz and 2 kHz. Also, the high frequency component and the low frequency component are separated within a frequency range from a frequency, at which the phase difference is adjusted into −180 (deg) at maximum, to 2 kHz.

Also, in order to achieve the above object, there is provided an audio synthetic method including:

inputting a first audio signal, a second audio signal and a third audio signal;

dividing the third audio signal into two divided third signals, which have a phase difference mutually in one frequency range;

synthesizing one of the two divided third signals and the first audio signal into a first synthetic signal;

synthesizing the other of the two divided third signals and the second audio signal into a second synthetic signal; and outputting the first synthetic signal and the second synthetic signal.

Also, in order to achieve the above object, there is provided an audio synthetic method including:

inputting a first audio signal, a second audio signal and a third audio signal;

separating the third audio signal into a high frequency signal and a low frequency signal at a predetermined frequency as a boarder;

dividing the low frequency signal into two divided low frequency signals, which have a phase difference mutually in one frequency range;

synthesizing one of the two divided low frequency signals and the first audio signal into a first synthetic signal;

synthesizing the other of the two divided low frequency signals and the second audio signal into a second synthetic signal; and outputting the first synthetic signal, the second synthetic signal and the high frequency signal.

In this manner, the binaural correlation coefficient of the sound being output from both front channel loudspeakers is corrected by supplying the low frequency component having the phase difference to the front-left channel loudspeaker and the front-right channel loudspeaker and also supplying the high frequency component of the center channel audio signal to the center channel loudspeaker, and the sound image of the vocal sound being output from the center channel loudspeaker can be positioned at the natural position, and thus the sound field with the reality sensation can be provided.

DETAILED DESCRIPTION OF THE PREFERRED EMBODIMENTS

Embodiments of an audio reproducing system according to the present invention will be explained with reference to FIGS. 1 to 6 hereinafter. In this case, as the preferred embodiment, an audio reproducing system provided in the compartment of the vehicle will be explained.

First Embodiment

An audio reproducing system according to a first embodiment will be explained with reference to FIGS. 1 to 3 hereunder.

Figure 1A:
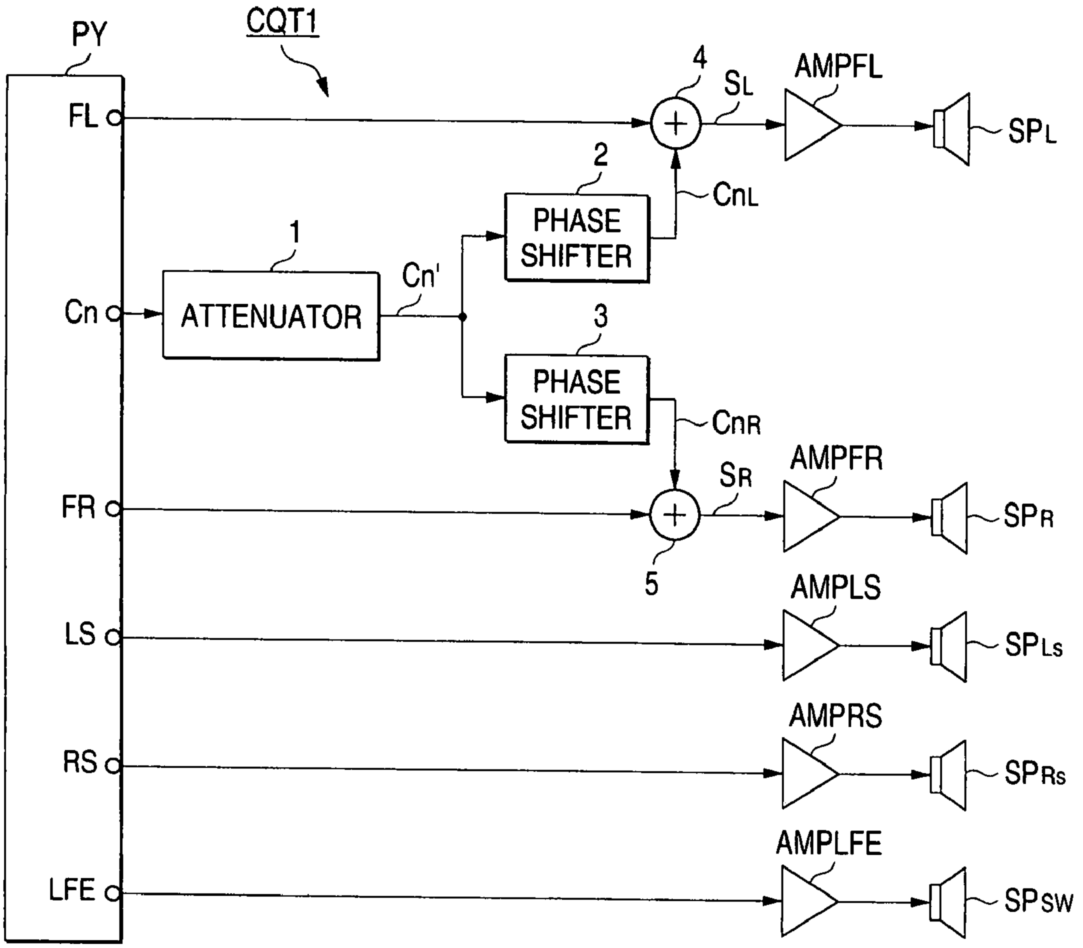
FIGS. 1A and 1B are views showing a configuration of an audio reproducing system according to a first embodiment.

FIG. 1A is a block diagram showing a configuration of the present audio reproducing system CQT1. When the audio signals FL, Cn, FR, LS, RS, LFE based on the "5.1-channel system" are supplied to the present audio reproducing system CQT1 from a sound source PY such as the CD (Compact Disc) player, the DVD (Digital Versatile Disc) player, the MD (Mini Disc) player, or the like provided to the vehicle-equipped audio system or the vehicle-equipped navigation system, such audio reproducing system CQT1 applies the predetermined signal processing to these audio signals and supplies these signals to the loudspeakers $SP_L$, $SP_R$, $SP_{Ls}$, $SP_{Rs}$, $SP_{SW}$.

In the present audio reproducing system CQT1, an attenuator 1 for attenuating the center-channel audio signal Cn to an appropriate level, phase shifters 2, 3 for adjusting a phase of the attenuated center-channel audio signal Cn' output from the attenuator 1, and adders 4, 5 are provided.

Figure 3A:
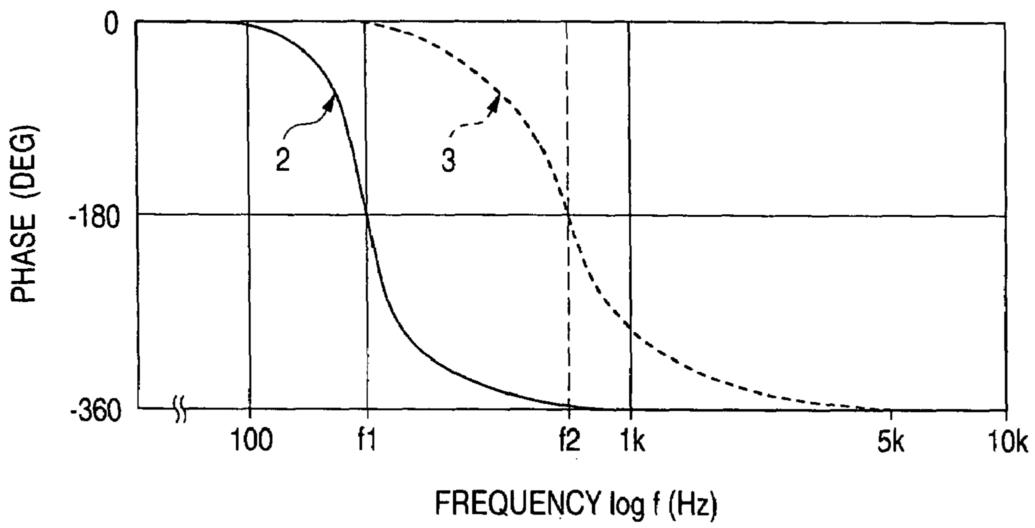
FIGS. 3A and 3B are views explaining a function of phase shifters incorporated into the audio reproducing system according to the first embodiment.

The phase shifters 2, 3 consist of the secondary variable phase shifter having a phase-frequency characteristic shown in FIG. 3A, and their natural frequencies f1, f2 and their Q values can be finely adjusted respectively by the external adjustment.

That is, the phase shifters 2, 3 cause respective phase shift amounts to lag in the span of 0 (deg) to −360 (deg). The phase shifter 2 changes the phase shift amount with respect to the supplied center-channel audio signal Cn' in the range of almost 0 (deg) to −360 (deg) at the frequency f (f≦f1) that is lower than the natural frequency f1, and also changes such phase shift amount in the range of almost −180 (deg) to −360 (deg) at the frequency f (f>f1) that is higher than the natural frequency f1. Also, the phase shifter 3 changes the phase shift amount with respect to the supplied center-channel audio signal Cn' in the range of almost 0 (deg) to −180 (deg) at the frequency f (f≦f2) that is lower than the natural frequency f2, and also changes such phase shift amount in the range of almost −180 (deg) to −360 (deg) at the frequency f (f>f2) that is higher than the natural frequency f2.

Then, when the user, or the like operates the adjusting knob (not shown) to adjust the operation amount, the phase shifters 2, 3 change their natural frequencies f1, f2 and their Q values in response to the operation amount.

In this manner, the phase shifters 2, 3 output center-channel audio signals $C_{nL}$, $C_{nR}$ to which the phase adjustment is applied by giving the phase shift amount to the center-channel audio signal Cn' on the basis of the natural frequencies f1, f2 respectively.

Figure 3B:
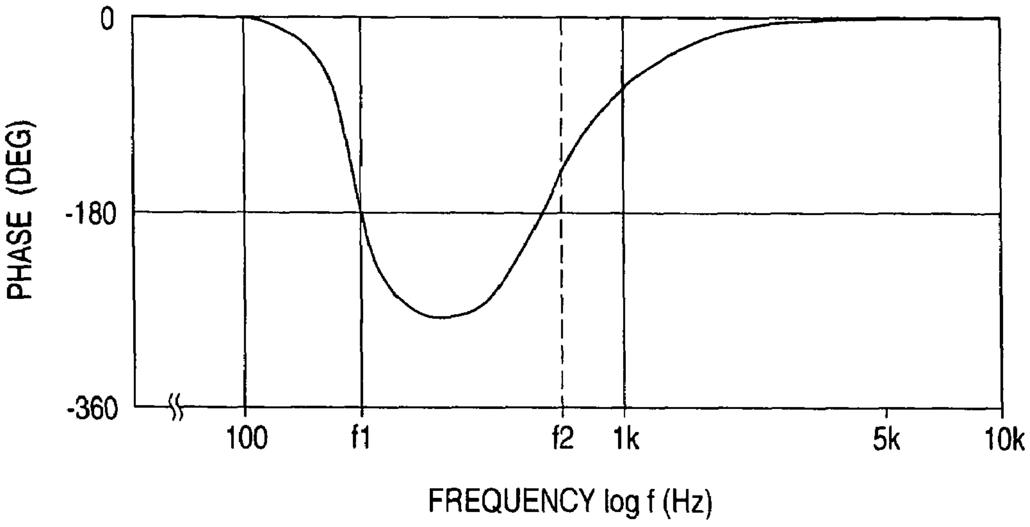

Also, when the phase shift amount of the difference between respective phase-frequency characteristics (phase difference) of the phase shifters 2, 3 shown in FIG. 3A is calculated, the negative peak value is generated between the natural frequencies f1, f2, as shown in FIG. 3B. Accordingly, the phase difference between the center-channel audio signals $C_{nL}$, $C_{nR}$, that are subjected to the phase adjustment, output from the phase shifters 2, 3 can be adjusted in accordance with the phase shift amount of the above difference.

The adder 4 synthesizes the center-channel audio signal $C_{nL}$ from the phase shifter 2 and the front-left channel audio signal FL from the sound source PY to generate the front-left channel synthesized audio signal $S_L$.

The adder 5 synthesizes the center-channel audio signal $C_{nR}$ from the phase shifter 3 and the front-right channel audio signal FR to generate the front-right channel synthesized audio signal $S_R$.

Then, the audio amplifier $AMP_{FL}$ power-amplifies the front-left channel synthesized audio signal $S_L$ and supplies the resultant signal to the front-left loudspeaker $SP_L$. The audio amplifier $AMP_{FR}$ power-amplifies the front-right channel synthesized audio signal $S_R$ and supplies the resultant signal to the front-right loudspeaker $SP_R$.

Also, a left-surround channel audio signal LS and a right-surround channel audio signal RS supplied from the sound source PY are power-amplified by the audio amplifiers $AMP_{LS}$, $AMP_{RS}$ respectively and then supplied to the left surround loudspeaker $SP_{Ls}$ and the right surround loudspeaker $SP_{Rs}$.

Also, the sub-woofer channel audio signal LFE is power-amplified by the audio amplifier $AMP_{LFE}$ and then supplied to the sub-woofer $SP_{SW}$.

Figure 1B:
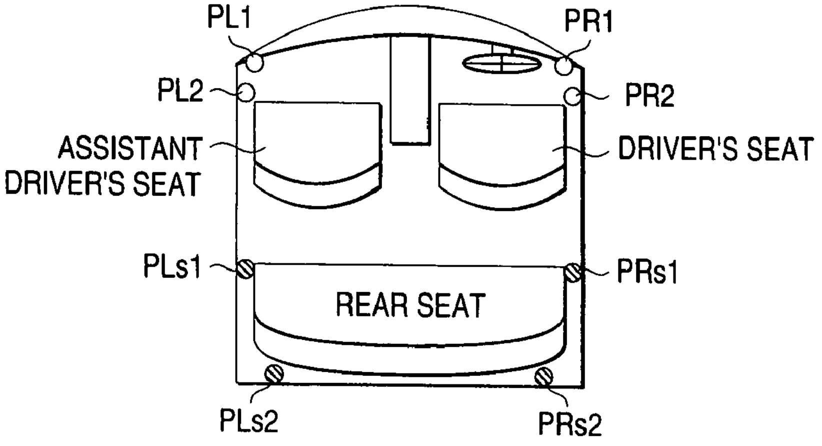

Next, as shown in FIG. 1B, the loudspeakers $SP_L$, $SP_R$, $SP_{Ls}$, $SP_{Rs}$, $SP_{SW}$ of five channels, as already described, are arranged in the compartment of the vehicle.

For example, the front-left loudspeaker $SP_L$ is arranged near the front dash board on the assistant driver's seat side or the front door indicated by the symbol PL1 or PL2 in FIG. 1B, and the front-right loudspeaker $SP_R$ is arranged near the front dash board on the driver's seat side or the front door indicated by the symbol PR1 or PR2. Also, the left surround loudspeaker $SP_{Ls}$ is arranged near the left-side door on the rear seat side and the back of the rear seat indicated by the symbol PLs1 or PLs2, and the right surround loudspeaker $SP_{Rs}$ is arranged near the right-side door on the rear seat side and the back of the rear seat indicated by the symbol PRs1 or PRs2. Also, the sub-woofer $SP_{SW}$ is provided at the appropriate position in the compartment.

According to the present audio reproducing system CQT1 having such configuration, even in the situation that the listening position of the passenger is not at the center position with respect to the loudspeakers $SP_L$, $SP_R$, $SP_{Ls}$, $SP_{Rs}$ arranged in the compartment, if the natural frequencies f1, f2 and the Q values of the phase shifter 2, 3 are adjusted by adjusting the operation amount of the adjusting knob described above, the binaural correlation coefficient $\rho_{LR}$ indicating the effect of the sound waves emitted from respective loudspeakers $SP_L$, $SP_R$, $SP_{Ls}$, $SP_{Rs}$ on both ears of the passenger can be corrected. Therefore, the unnatural sound image normal, or the unclearness of the sound image normal and the dangling-about of the sound, etc. can be suppressed, and thus the sound with the reality sensation can be achieved.

Here, the principle that makes it possible to realize the sound with the reality sensation and the experimental results will be explained with reference to FIGS. 2 and 3 hereunder.

Figure 2A:
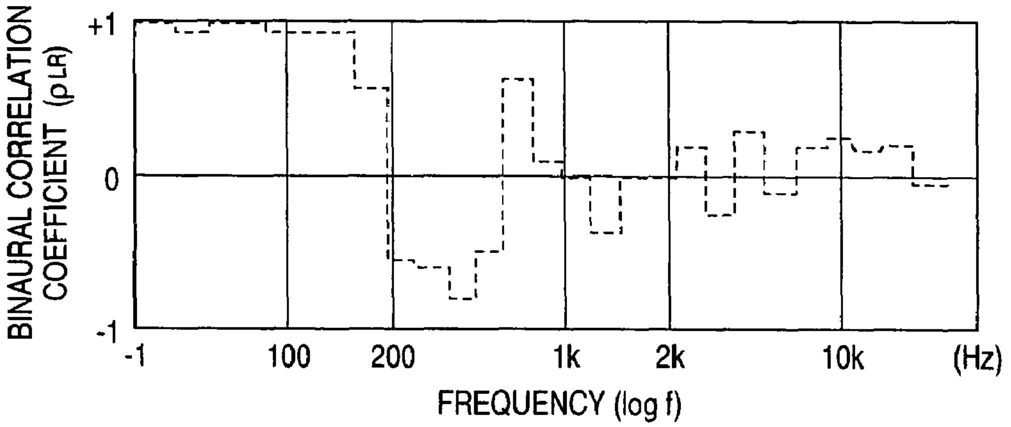
FIGS. 2A to 2C are views explaining a function of the audio reproducing system according to the first embodiment.
Figure 2B:
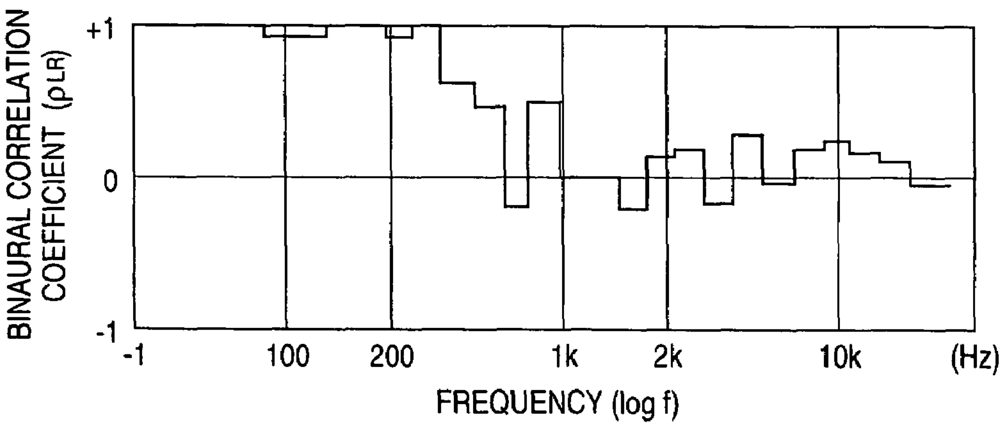

FIG. 2A shows the measured result of the binaural correlation coefficient $\rho_{LR}$ of in the prior art, as described above. FIG. 2B shows the measured result of the binaural correlation coefficient $\rho_{LR}$ obtained when the loudspeakers $SP_L$, $SP_R$, $SP_{Ls}$, $SP_{Rs}$, which are arranged as shown in FIG. 1B, and the sub-woofer $SP_{SW}$ are sounded by the present audio reproducing system CQT1. In addition, FIG. 2C shows the measured results of the binaural correlation coefficient $\rho_{LR}$ in FIGS. 2A and 2B to overlap.

If the driver takes the driver's seat near the front-right loudspeaker $SP_R$ shown in FIG. 1B and then adjusts the natural frequencies f1, f2 of the phase shifters 2, 3 at the predetermined Qs to about 200 Hz and about 600 Hz respectively by adjusting the operation amounts of the adjusting knobs described above, the binaural correlation coefficient $\rho_{LR}$ of the driver as shown in FIGS. 2A and 2B can be derived.

Figure 2C:
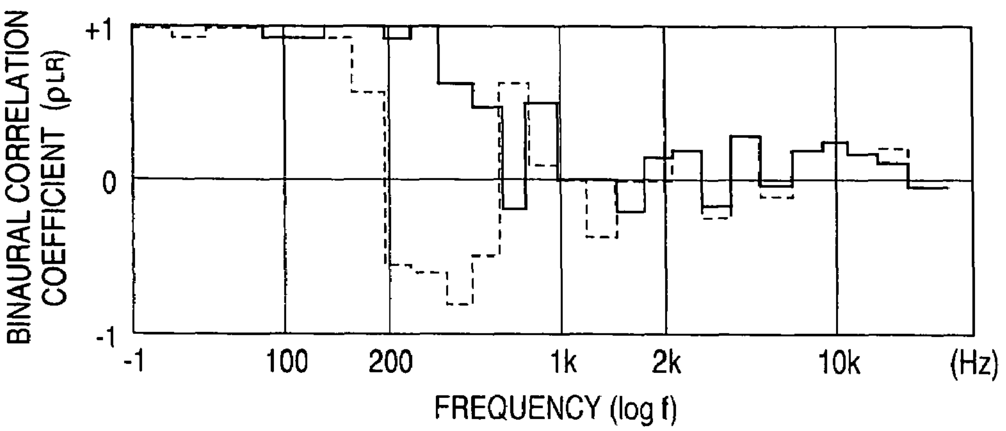

Here, as apparent from FIG. 2C, the binaural correlation coefficient $\rho_{LR}$ takes the substantially positive value in the range of about 200 Hz to about 600 Hz. As a result, generations of the unnatural sound image normal, and the unclearness of the sound image normal and the dangling-about of the sound, etc., which are the problems in the prior art, can be suppressed, and thus it is possible to provide the sound with the reality sensation.

It may be considered that such improvement in the binaural correlation coefficient $\rho_{LR}$ can be realized based on the principle described in the following.

In other words, if the natural frequencies f1, f2 of the phase shifters 2, 3 are adjusted to about 200 Hz and about 600 Hz respectively, the phase-frequency characteristics of the phase shifters 2, 3 are brought into the overlapped state, as shown in FIG. 3A. As a result, the phase difference between the center-channel audio signals $C_{nL}$, $C_{nR}$ is given as shown in FIG. 3B.

Then, the front-left channel synthesized audio signal $S_L$ containing the center-channel audio signal $C_{nL}$ having the above phase difference and the front-right channel synthesized audio signal SR containing the center-channel audio signal $C_{nR}$ are generated by synthesizing the center-channel audio signals $C_{nL}$, $C_{nR}$, both having such phase difference, to the front left-channel audio signal FL and the front right-channel audio signal FR. Thus, the sound waves, which are output from the front-left loudspeaker $SP_L$ based on the front-left channel synthesized audio signal $S_L$, and the sound waves, which are output from the front-right loudspeaker $SP_R$ based on the front-right channel synthesized audio signal $S_R$, comes up to both ears of the driver.

In this fashion, when the sound waves that are reproduced based on the center-channel audio signals $C_{nL}$, $C_{nR}$, to which the phase difference is given mutually by the phase shifters 2, 3, reach both ears of the driver from the front-left and front-right loudspeaker $SP_L$, $SP_R$, the sound images that are generated by the sound waves, which come into the right and left ears of the driver from the front-left loudspeaker $SP_L$ based on the center-channel audio signal $C_{nL}$, and the sound waves, which come into the right and left ears of the driver from the front-right loudspeaker $SP_R$ based on the center-channel audio signal $C_{nR}$, can be fixedly positioned on the front side of the driver.

As a result, as shown in FIGS. 2B and 2C, the binaural correlation coefficient $\rho_{LR}$ takes the positive value in the actually measured range of about 200 Hz to about 600 Hz. Consequently, generations of the unnatural sound image normal, and the unclearness of the sound image normal and the dangling-about of the sound, etc., which are the problems in the prior art, can be suppressed, and thus it is possible to provide the sound with the reality sensation.

In this case, the case where the binaural correlation coefficient $\rho_{LR}$ is corrected with respect to the driver has been explained. Similarly, the binaural correlation coefficient $\rho_{LR}$ can be corrected with respect to the passenger who seated on the assistant driver's seat side.

In other words, the seated position of the driver and the seated position of the passenger are almost symmetrical with respect to the loudspeakers $SP_L$, $SP_R$, $SP_{Ls}$, $SP_{Rs}$. For this reason, when the sound waves that are reproduced based on the center-channel audio signals $C_{nL}$, $C_{nR}$, to which the phase difference is allocated mutually by the phase shifters 2, 3, reach both ears of the passenger from the front-left and front-right loudspeakers $SP_L$, $SP_R$, the sound images that are generated by the sound waves, which come into the right and left ears of the passenger from the front-left loudspeaker $SP_L$ based on the center-channel audio signal $C_{nL}$, and the sound waves, which come into the right and left ears of the passenger from the front-right loudspeaker $SP_R$ based on the center-channel audio signal $C_{nR}$, can be fixedly positioned on the front side of the passenger.

As a result, like the case shown in FIGS. 2B and 2C, the binaural correlation coefficient $\rho_{LR}$ with respect to the passenger takes the positive value in the range of about 200 Hz to about 600 Hz. Consequently, like the case of the driver, generations of the unnatural sound image normal, and the unclearness of the sound image normal and the dangling-about of the sound, etc., which are the problems in the prior art, can be suppressed against the passenger who sits in the assistant driver's seat, and thus it is possible to provide the sound with the reality sensation.

In this manner, according to the first embodiment, it is possible to provide the sound with the reality sensation to both the driver and the passenger.

Also, as the preferred embodiment, the case where the binaural correlation coefficient $\rho_{LR}$ is corrected in the compartment of the vehicle has been explained. Similarly, the binaural correlation coefficient $\rho_{LR}$ can also be corrected in the audio system provided to the house, etc.

Also, since the heavy low sound emitted from the sub-woofer $SP_{SW}$ does not have the sharp directivity to the listener (the driver, the passenger, or the like), the unnatural sound image normal, or the unclearness of the sound image normal and the dangling-about of the sound, etc. can be suppressed even when the sub-woofer $SP_{SW}$ is not sounded. In addition, the present audio reproducing system CQT1 can correct the binaural correlation coefficient $\rho_{LR}$ by applying the predetermined phase control described above to the center-channel audio signals Cn and then supplying the resultant signals to the front-left and front-right loudspeakers $SP_L$, $SP_R$. Therefore, even if the sub-woofer $SP_{SW}$ and the left and right surround loudspeaker $SP_{Ls}$, $SP_{Rs}$ are not sounded, the generations of the unnatural sound image normal, and the unclearness of the sound image normal and the dangling-about of the sound, etc. can be suppressed.

Accordingly, the present audio reproducing system CQT1 may have at least a configuration that can generate the synthesized audio signals $S_L$, $S_R$ to be supplied to the front-left and front-right loudspeakers $SP_L$, $SP_R$.

The phase shifters 2, 3 that are incorporated into the present audio reproducing system CQT1 have a configuration that can finely adjust the natural frequencies f1, f2. But a configuration in which their natural frequencies f1, f2 are fixed to above 200 Hz and 600 Hz respectively may be employed.

Second Embodiment

Next, a second embodiment will be explained with reference to FIG. 4 hereunder. In this case, FIG. 4 is a block diagram showing a configuration of an audio reproducing system according to the second embodiment, and portions that are same as or equivalent to those in FIG. 1A are denoted by the same symbols.

Figure 4:
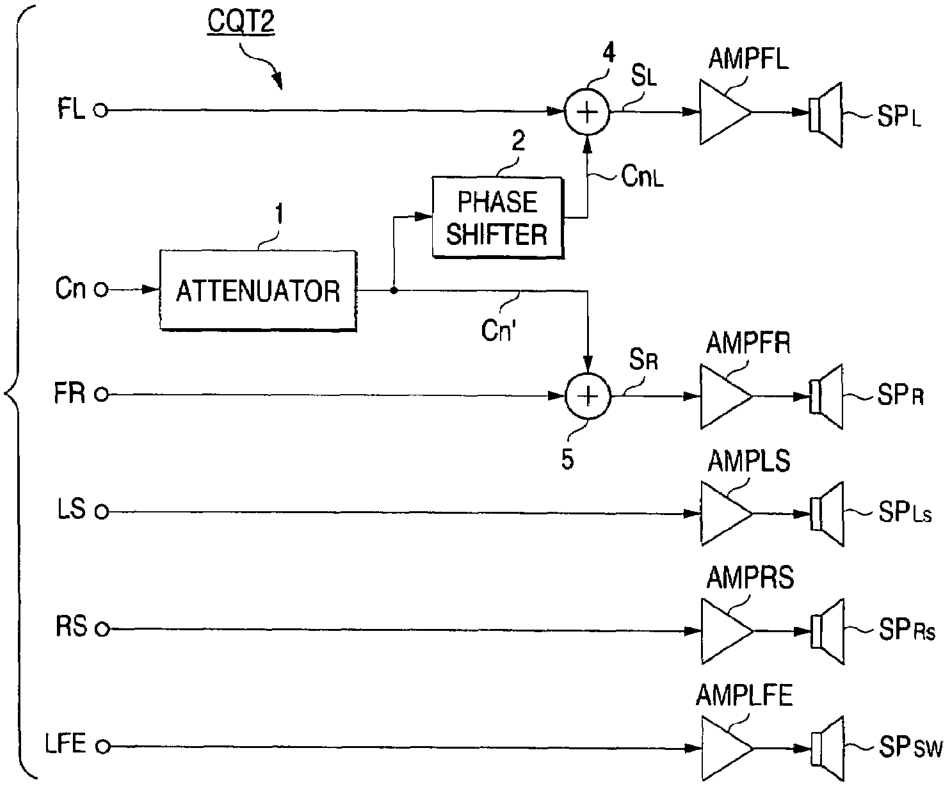
FIG. 4 is a view showing a configuration of an audio reproducing system according to a second embodiment.

In FIG. 4, the difference from the first embodiment will be described hereunder. In the present audio reproducing system CQT2, the phase shifter 2 for applying the phase adjustment to the center-channel audio signal Cn' output from the attenuator 1 is provided to one channel only.

Then, the adder 4 provided on the front-left channel side synthesizes the center channel audio signal $C_{nL}$, which is output from the phase shifter 2 and is subjected to the phase adjustment, and the front-left channel audio signal FL from the sound source (not shown) to generate the front-left channel synthesized audio signal $S_L$. Also, the adder 5 provided on the front-right channel side synthesizes the center channel audio signal Cn' from the attenuator 1 and the front-right channel audio signal FR from the sound source to generate the front-right channel synthesized audio signal $S_R$.

Now, the phase shifter 2 is constructed by a variable phase shifter having the phase-frequency characteristic shown in FIG. 3B. More particularly, the phase shifter 2 is constructed by the variable phase shifter that is constructed by using two phase shifters having the adjustable natural frequencies f1, f2 shown in FIG. 3A in combination, etc.

According to the present audio reproducing system CQT 2 having such configuration, if the driver takes the driver's seat near the front-right loudspeaker $SP_R$ side shown in FIG. 1B and then adjusts the negative peak value of the phase shift amount of the phase shifter 2 within the range of about 200 Hz and about 600 Hz shown in FIG. 3B, the binaural correlation coefficient $\rho_{LR}$ of the driver as shown in FIGS. 2A and 2B can be derived.

As a consequence, the generations of the unnatural sound image normal feeling, and the unclearness of the sound image normal and the dangling-about of the sound, etc., which are the problems in the prior art, can be suppressed, and it is possible to provide the sound with the reality sensation.

Also, the binaural correlation coefficient $\rho_{LR}$ can be corrected similarly with respect to the passenger who sits on the assistant driver's seat. That is, since the seated position of the driver and the seated position of the passenger are almost symmetrical with respect to the loudspeakers $SP_L$, $SP_R$, $SP_{Ls}$, $SP_{Rs}$, the binaural correlation coefficient $\rho_{LR}$ with respect to the passenger takes the positive value in the range of about 200 Hz to about 600 Hz, like the case shown in FIGS. 2B and 2C. Therefore, like the case of the driver, the generations of the unnatural sound image normal, and the unclearness of the sound image normal and the dangling-about of the sound, etc. can be suppressed against the passenger who sits on the assistant driver's seat, and thus it is possible to provide the sound with the reality sensation.

In this fashion, according to the second embodiment, it is possible to provide the sound with the reality sensation to both the driver and the passenger.

Also, the correction of the binaural correlation coefficient $\rho_{LR}$ is not limited in the compartment of the vehicle, and such binaural correlation coefficient $\rho_{LR}$ can be corrected similarly in the audio system provided to the house, etc.

Also, in the second embodiment shown in FIG. 4, a configuration in which the phase shifter 2 is interposed between the attenuator 1 and the adder 4 and also the attenuator 1 is directly connected to the adder 5 is employed. But a configuration that is opposite to such configuration may be employed, i.e., the configuration in which the phase shifter 2 is interposed between the attenuator 1 and the adder 5 and also the attenuator 1 is directly connected to the adder 4 may be employed.

Also, in the second embodiment shown in FIG. 4, the phase characteristic of the phase shifter 2 is constructed by the variable phase shifter having the phase-frequency characteristic shown in FIG. 3B. However, the phase shifter 2 shown in FIG. 4 may be constructed by the phase shifter 2 shown in FIG. 1 or the phase shifter 3 shown in FIG. 1. That is, the phase shifter 2 shown in FIG. 4 may be set to have the phase-frequency characteristic indicated by the characteristic curve 2 in FIG. 3A. In summary, any phase shifter that has the phase-frequency characteristic to invert the phase in the range of about 200 Hz to about 600 Hz may be employed.

According to such configuration, the phase difference of the center-channel audio signal $C_{nL}$, which is subjected to the phase adjustment, to the center-channel audio signal Cn' in FIG. 4 gives the phase-frequency characteristic in FIG. 3A. That is, in the frequency band in excess of about 1 kHz, the phase difference of the center-channel audio signal $C_{nL}$ to the center-channel audio signal Cn' does not come close to 0 (deg) as shown in FIG. 3B, but comes close to about −360 (deg) as shown in FIG. 3A.

However, the phase difference of the center-channel audio signal $C_{nL}$, which is subjected to the phase adjustment, to the center-channel audio signal Cn' becomes similar to the phase-frequency characteristic shown in FIG. 3B in the frequency band that is lower than about 1 kHz. For this reason, the binaural correlation coefficient $\rho_{LR}$ having the positive value can be obtained like the case in FIGS. 2B and 2C in this low frequency band, and thus the problems-such as the generations of the unnatural sound image normal feeling, the unclearness of the sound image normal, the dangling-about of the sound, etc. can be overcome. In addition, since the wavelength of the sound wave in the frequency band that is higher than about 1 kHz is shorter than the distance between both ears, there is exhibited such a tendency that the phase relationship comes close to the uncorrelation ($\rho_{LR}$=0), as shown in FIGS. 2A to 2C. Therefore, unless the phase-frequency characteristic of the phase shifter 2 is returned to 0 (deg) in the frequency of more than about 1 kHz as shown in the characteristic curve in FIG. 3A, the binaural correlation coefficient $\rho_{LR}$ comes close to 0 because the wavelength of the sound wave in the high frequency band is shorter than the distance between both ears. As a result, the problems such as the generations of the unnatural sound image normal feeling, the unclearness of the sound image normal, the dangling-about of the sound, etc. are not caused.

Also, the seated position of the driver and the seated position of the passenger are almost symmetrical with respect to the loudspeakers $SP_L$, $SP_R$, $SP_{Ls}$, $SP_{Rs}$. Therefore, even if the phase-frequency characteristic of the phase shifter 2 is set to the phase-frequency characteristic given by the characteristic curve 2 in FIG. 3A, it is possible to provide the sound field with the reality sensation equally to both the driver and the passenger.

Also, as described above, the configuration in which the phase shifter 2 is interposed between the attenuator 1 and the adder 5, and the attenuator 1 and the adder 4 are directly connected may be employed, and also the phase-frequency characteristic of the phase shifter 2 may be set to the phase-frequency characteristic given by the characteristic curve 2 in FIG. 3A.

Also, the phase shifter 2 incorporated into the present audio reproducing system may be fixed to the phase-frequency characteristic given in FIG. 3B.

Third Embodiment

Next, a third embodiment will be explained with reference to FIGS. 5 and 6 hereunder. In this case, FIG. 5A is a block diagram showing a configuration of the audio reproducing system CQT3 according to the third embodiment, and portions that are same as or equivalent to those in FIG. 1A are denoted by the same symbols.

Figure 5A:
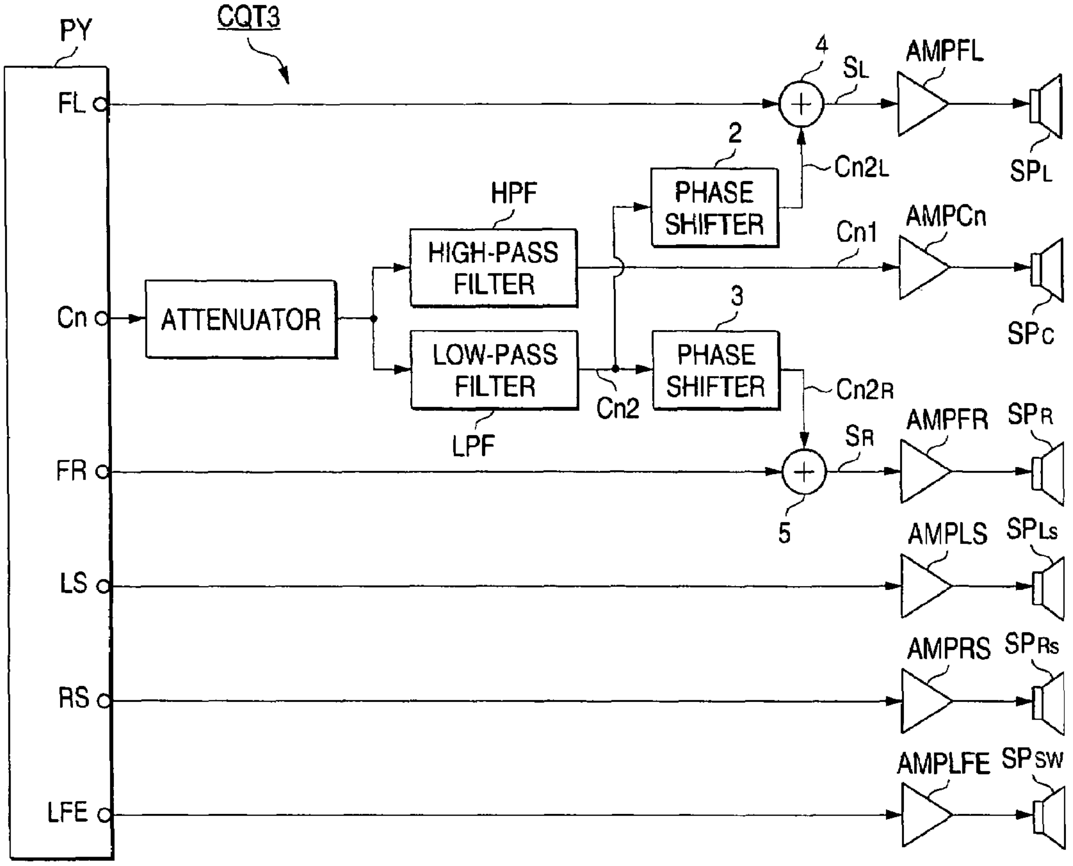
FIGS. 5A and 5B are views showing a configuration of an audio reproducing system according to a third embodiment.

In FIG. 5A, the difference from the first embodiment will be explained. The present audio reproducing system CQT3 supplies the center-channel audio signal Cn output from the sound source PY to a high-pass filter HPF and a low-pass filter LPF via the attenuator (the symbol is not affixed), and then outputs the high-frequency component $C_{n1}$ of the center-channel audio signal Cn that is passed through the high-pass filter HPF (referred to as a "high-frequency center-channel audio signal" hereinafter) to the center loudspeaker $SP_C$ side without the phase compensation and also supplies the low-frequency component $C_{n2}$ of the center-channel audio signal Cn that is passed through the low-pass filter LPF (referred to as a "low-frequency center-channel audio signal" hereinafter) to the phase shifters 2, 3 to apply the phase compensation.

In addition, the low-frequency center-channel audio signal $C_{n2L}$ whose phase is adjusted by the phase shifter 2 is supplied to the adder 4 on the front-left channel side. Also, the low-frequency center-channel audio signal $C_{n2R}$ whose phase is adjusted by the phase shifter 3 is supplied to the adder 5 on the front-right channel side.

Figure 6:
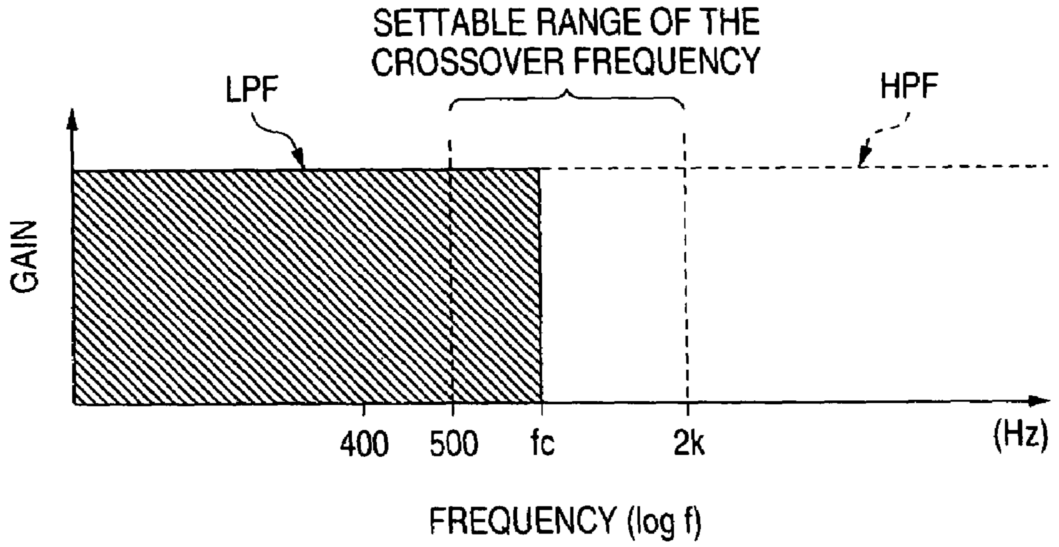
FIG. 6 is a view showing characteristics of a high-pass filter and a low-pass filter incorporated into the audio reproducing system according to the third embodiment.

Here, as shown in FIG. 6, both the high-pass filter HPF and the low-pass filter LPF have the cut-off characteristic of the primary frequency or more. These cut-off frequencies are set to any crossover frequency fc in the range of about 500 Hz to about 2 kHz. That is, the high-pass filter HPF has the frequency that is over the crossover frequency fc as the passing frequency band, and the low-pass filter LPF has the frequency that is under the crossover frequency fc as the passing frequency band.

In this case, the phase shifters 2, 3 have the phase-frequency characteristic that is the same as the variable phase shifter shown in FIG. 1A, and the adders 4, 5 are the same as the adders shown in FIG. 1A.

The adder 4 synthesizes the low-frequency center-channel audio signal $C_{n2L}$ supplied from the phase shifter 2 and the front-left channel audio signal FL supplied from the sound source PY to generate the front-left channel synthesized audio signal $S_L$. Also, the adder 5 synthesizes the high-frequency center-channel audio signal $C_{n2R}$ supplied from the phase shifter 3 and the front-right channel audio signal FR supplied from the sound source PY to generate the front-right channel synthesized audio signal SR.

Then, the audio amplifier $AMP_{FL}$ power-amplifies the front-left channel synthesized audio signal $S_L$ to supply to the front-left loudspeaker $SP_L$. Also, the audio amplifier $AMP_{FR}$ power-amplifies the front-right channel synthesized audio signal $S_R$ to supply to the front-right loudspeaker $SP_R$.

Also, the left-surround channel audio signal LS and the right-surround channel audio signal RS, both being supplied from the sound source PY, are power-amplified by the audio amplifiers $AMP_{LS}$, $AMP_{RS}$ respectively and then supplied to the left surround loudspeaker $SP_{LS}$ and the right surround loudspeaker $SP_{Rs}$. In addition, the sub-woofer channel audio signal LFE is power-amplified by the audio amplifier $AMP_{LFE}$ and then supplied to the sub-woofer $SP_{SW}$.

Figure 5B:
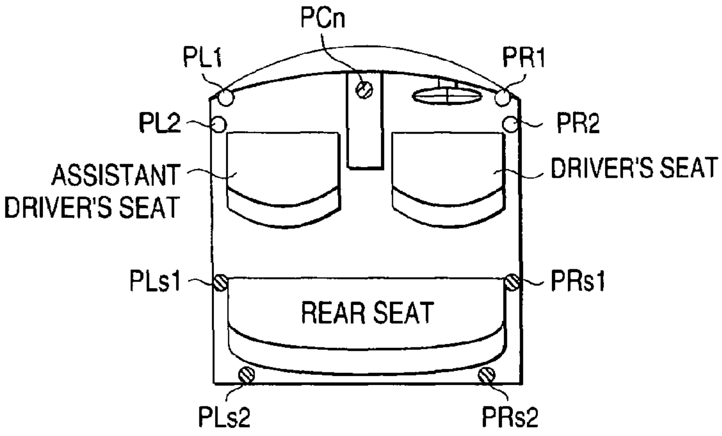

Here, as shown in FIG. 5B, the front-left and the front-right loudspeakers $SP_L$, $SP_R$ and the left and right surround loudspeakers $SP_{Ls}$, $SP_{Rs}$ are arranged at the predetermined positions in the compartment, like the case shown in FIG. A. Also, the center loudspeaker $SP_C$ is provided at the center portion of the instrument panel of the vehicle (the so-called center panel) or its neighboring area.

Also, as the center loudspeaker $SP_C$ provided to the center panel or its neighboring area, the small diameter loudspeaker that is provided previously to the vehicle-equipped audio system or the vehicle-equipped navigation system can be utilized.

According to the audio reproducing system CQT3 having such configuration, the sound image can be fixed at the more natural position than the audio reproducing systems CQT1, CQT2 in the above-mentioned first and second embodiments, and the generations of the dangling-about of the sound, etc. can be suppressed, and thus the sound with the reality sensation can be provided.

In particular, the driver and the passenger who sit on the driver's seat and the assistant driver's seat, which are provided to the positions deviated from the center panel, respectively can listen the vocal sound (the voice of the human beings, etc.), which is emitted from the center loudspeaker $SP_C$ provided to the center panel, as the vocal sound emitted from the center loudspeaker $SP_C$.

Figure 7A:
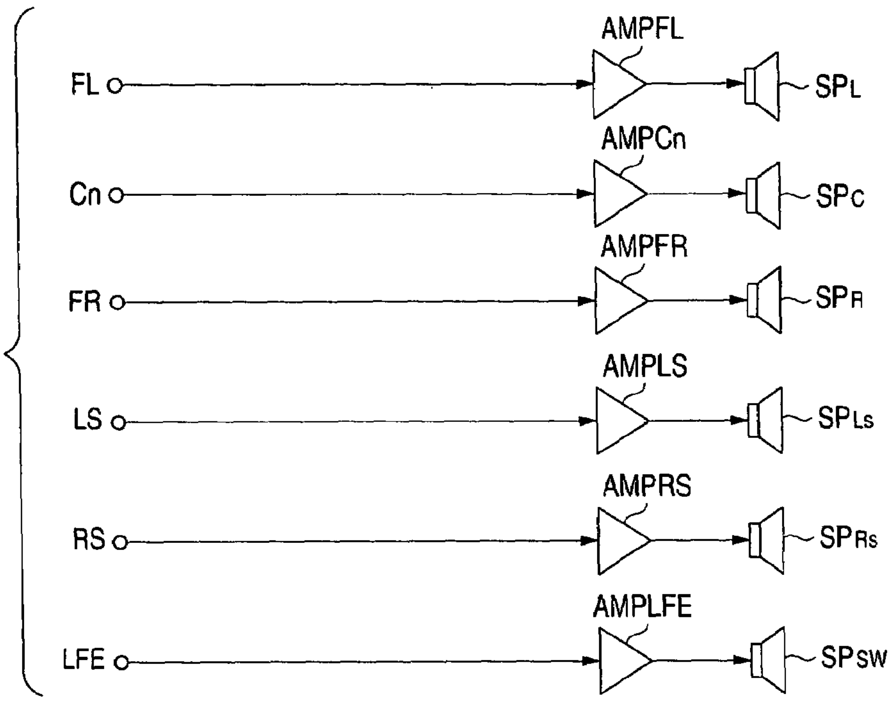
FIGS. 7A and 7B are views explaining the problem in the audio system of the 5.1-channel system in the prior art.
Figure 7B:
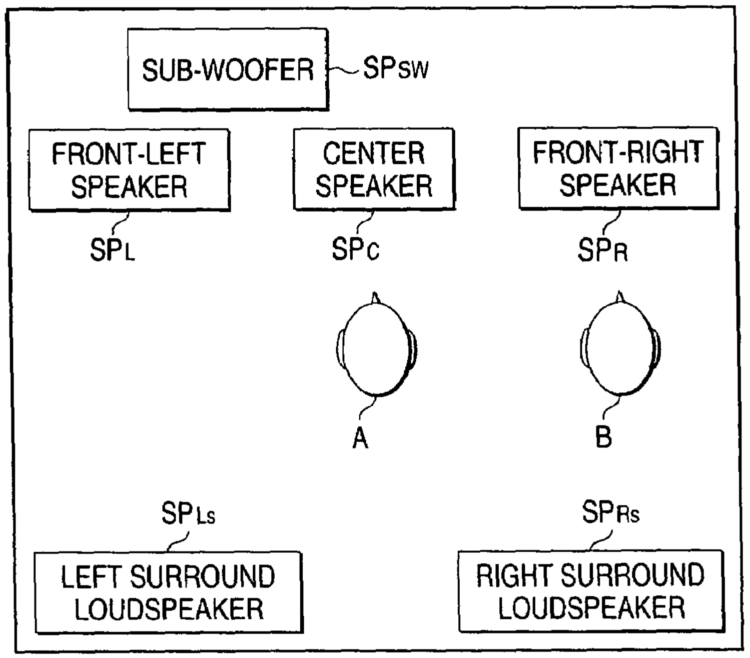
Figure 8A:
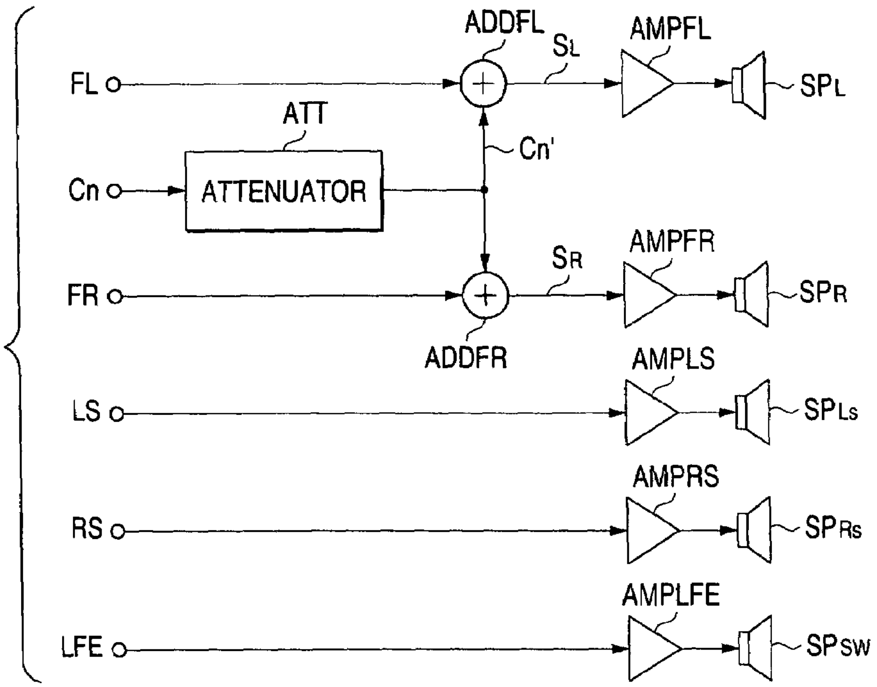
FIGS. 8A and 8B are views explaining the problem in the audio system of the pseudo system in the prior art.
Figure 8B:
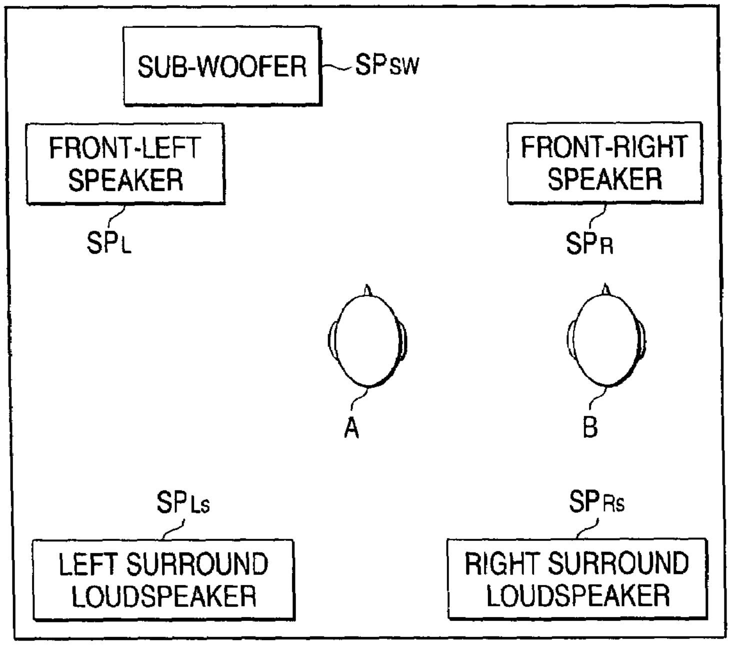

In other words, as the problem in the prior art, if the listener is positioned as the position B shown in FIG. 7B (the position deviated from the center loudspeaker $SP_C$), sometimes there occurs the unnatural case such that the sound image of the vocal sound emitted from the center loudspeaker $SP_C$ is normally positioned at the back of the head of the listener. However, according to the present audio reproducing system CQT3, the sound image of the vocal sound emitted from the center loudspeaker $SP_C$ can be positioned fixedly in front of the listener and on the center loudspeaker $SP_C$ side.

As a result, the sound image of the vocal sound can be positioned at the more natural position against the listener (the driver and the passenger). In addition, this sound image can be positioned fixedly at the more natural position than the first and second embodiments and in turn the sound with the reality sensation can be realized.

Next, the principle that makes it possible to achieve the sound with the reality sensation by the present audio reproducing system CQT3 will be explained hereunder.

As shown in FIG. 6, the passing frequency bands of the high-pass filter HPF and the low-pass filter LPF are decided by using the crossover frequency fc as the boarder. In contrast, as shown in FIG. 3B, the phase shift amount of the difference between the phase shifters 2, 3 has the negative peak value in vicinity of about 400 Hz, and the frequency range in which the phase shift amount is reduced to almost 0 (deg) extends over about 200 Hz to about 1 kHz.

Therefore, the phase shifters 2, 3 apply the phase adjustment in the range of about 200 Hz to about 1 kHz shown in FIG. 3B to the low-frequency center-channel audio signal $C_{n2}$ as the low frequency component that is passed through the low-pass filter LPF. In contrast, the phase shifters 2, 3 do not apply the phase adjustment to the high-frequency center-channel audio signal $C_{n1}$ that is passed through the high-pass filter HPF.

In this manner, the front-left channel synthesized audio signal $S_L$ is generated by synthesizing the low-frequency center-channel audio signal $C_{n2L}$ as the low frequency component, which is passed through the low-pass filter LPF and to which the phase adjustment is applied from the phase shifter 2, and the front-left channel audio signal FL by virtue of the adder 4. In addition, the front-right channel synthesized audio signal $S_R$ is generated by synthesizing the low-frequency center-channel audio signal $C_{n2R}$ as the low frequency component, which is passed through the low-pass filter LPF and to which the phase adjustment is applied from the phase shifter 3, and the front-right channel audio signal FR by virtue of the adder 5.

Then, two sounds that are generated by the front-left channel synthesized audio signal SL and the front-right channel synthesized audio signal SR are output from the front-left and front-right loudspeakers $SP_L$, $SP_R$. In addition, the sound that is generated by the high-frequency center-channel audio signal $C_{n1}$ is output from the center loudspeaker $SP_C$ arranged between the front-left and front-right loudspeakers $SP_L$, $SP_R$.

In this fashion, when the sounds are output from the front-left and front-right loudspeakers $SP_L$, $SP_R$ and the center loudspeaker $SP_C$, the sound image of the vocal sound can be normally positioned at the position that is suited to the hearing sense of the listener (the driver and the passenger).

In other words, in the third embodiment, the sound image position of the low frequency component is brought close to the actual position of the center loudspeaker $SP_C$ in the pseudo-manner by correcting the phase of the low frequency component of the center-channel audio signal Cn, that is insensitive to the sound image normal, to sound the front loudspeakers $SP_L$, $SP_R$, and also the high frequency component of the center-channel audio signal Cn, that is sensitive to the sound image normal, is sounded by the actual center loudspeaker $SP_C$. Therefore, the listener (the driver and the passenger) can get the feeling such that the sound of the low frequency component, that is insensitive to the sound image normal, is emitted from the center loudspeaker $SP_C$.

Also, since the sound of the low-frequency center-channel audio signal $C_{n2}$ is sounded by both front loudspeakers $SP_L$, $SP_R$, the small-size center loudspeaker $SP_C$ can be employed, and thus the effect for not-narrowing the inside of the compartment with the limited volume, etc. can be achieved. Therefore, the small-size loudspeaker that is built in the monitor of the vehicle-equipped navigation system, etc. can be utilized as the center loudspeaker $SP_C$, and thus the effect of eliminating the provision of the new center loudspeaker, etc. can be achieved.

In this connection, in the case that the diameters of the front-left and front-right loudspeakers $SP_L$, $SP_R$ are in excess of 16 cm, if the diameter of the small-size loudspeaker that is equipped previously in the vehicle-equipped navigation system, or the like, for example, is more than about 50 mm, the above-mentioned effect can be achieved by utilizing such loudspeaker as the center loudspeaker $SP_C$.

Also, in this case, the above-mentioned effect can be obtained by setting the cut-off frequencies (crossover frequencies) fc of the high-pass filter HPF and the low-pass filter LPF to about 1 kHz. For example, the synthesized voice (the voice sound) generated by the voice synthesizer, that is equipped in the vehicle-equipped navigation system, can be clearly listened at the driver's seat and the assistant driver's seat as the sound that is positioned fixedly on the center loudspeaker side.

Also, the reproduced frequency band is shifted to the higher frequency side as the diameter of the loudspeaker becomes smaller, so that such loudspeaker cannot reproduce the sound at the low frequency. Therefore, if the small-diameter loudspeaker having the reproduced frequency band that is equivalent to the passing frequency band of the high-pass filter HPF is utilized as the center loudspeaker $SP_C$, the high-pass filter HPF provided to the present audio reproducing system CQT3 may be omitted and also the center-channel audio signal Cn may be directly supplied to the center loudspeaker $SP_C$ via the audio amplifier $AMP_{Cn}$.

As the preferred embodiment, the audio reproducing system provided to the compartment of the vehicle is explained. But the present audio reproducing system may be applied to the audio system provided to the housing, etc.

Also, in the first embodiment shown in FIG. 1, the center-channel audio signals $C_{nL}$, $C_{nR}$, which have the above phase difference, are generated by providing two independent phase shifters 2, 3. But the present invention can be constructed by grasping these phase shifters 2, 3 as one phase-shifting section.

Also, in the second embodiment shown in FIG. 4, the center-channel audio signal $C_{nL}$ that has the predetermined phase difference with respect to the center-channel audio signal Cn' is generated by one phase shifter 2. But the present invention can be constructed by grasping the phase shifter 2 as one phase-shifting section that generates the center-channel audio signal Cn' and the center-channel audio signal $C_{nL}$.

Also, in the third embodiment shown in FIG. 5, the high-frequency component $C_{n1}$ and the low-frequency component $C_{n2}$ are generated by providing the high-pass filter HPF and the low-pass filter LPF. But the present invention can be constructed by combining the high-pass filter HPF and the low-pass filter LPF as one filtering section. Also, the present invention can be constructed by grasping two phase shifters 2, 3 shown in FIG. 5 as one phase-shifting section.

Also, in the above-explained first to third embodiments, the audio reproducing system in which the audio signal is supplied from the sound source such as the CD player, the DVD player, the MD player, etc. is explained. But the present audio reproducing system can utilize the audio signal that is streamed via the communicating section such as the Internet, etc.

Also, the case where the above-mentioned audio reproducing systems CQT1, CQT2, CQT3 are constructed by the hardware is explained. In this case, the computer program that is able to exhibit the same function as these audio reproducing systems CQT1, CQT2, CQT3 may be formulated and then such computer program may be executed by the microprocessor (MPU) that is built in the personal computer, etc.

Also, the storage medium for recording the above computer program may be fabricated and then supplied to the user, etc., and then the above computer program may be installed into the personal computer, etc. and executed by the microprocessor (MPU). In addition, the above computer program may be streamed via the communicating section such as the Internet, etc., and then such computer program may be downloaded into the personal computer, etc. and executed by the microprocessor (MPU).

As described above, the audio reproducing system of the present invention generates two center-channel audio signals, which have the phase difference mutually in the predetermined frequency range, from the center-channel audio signal supplied from the sound source, and supplies the first synthesized audio signal, which is generated by synthesizing one center-channel audio signal that is subjected to the phase adjustment and the front-left channel audio signal, to the front-left channel loudspeaker and also supplies the second synthesized audio signal, which is generated by synthesizing the other center-channel audio signal that is subjected to the phase adjustment and the front-right channel audio signal, to the front-right channel loudspeaker. Therefore, the natural sound image normal, etc. can be realized by correcting the binaural correlation coefficient of the sounds that are output from the loudspeakers on both the front-left and front-right channels, and thus the sound field with the reality sensation can be provided.

Also, the audio reproducing system of the invention supplies the predetermined high frequency component of the center-channel audio signal to the center-channel loudspeaker, generates two low frequency components, which have the different phase mutually in the predetermined frequency range, from the predetermined low frequency component of the center-channel audio signal, supplies the first synthesized audio signal, which is generated by synthesizing one low frequency component that is subjected to the phase adjustment and the front-left channel audio signal, to the front-left channel loudspeaker, and supplies the second synthesized audio signal, which is generated by synthesizing the other low frequency component that is subjected to the phase adjustment and the front-right channel audio signal, to the front-right channel loudspeaker. Therefore, the binaural correlation coefficient of the sounds that are output from the loudspeakers on both the front-left and front-right channels can be corrected, and the sound image of the vocal sound being output from the center channel loudspeaker can be positioned fixedly at the natural position, and thus the sound field with the reality sensation can be provided.

What is claimed is:

1. An audio synthesizing system for causing a first loudspeaker and a second loudspeaker to produce sound by a first audio signal, a second audio signal and a third audio signal, said first audio signal, second audio signal and third signal being supplied from a sound source, said audio synthesizing system comprising:

an input section for inputting the first audio signal, the second audio signal and the third audio signal;

a dividing section for dividing the third audio signal into two divided third signals, which have a phase difference mutually in one frequency range;

a first synthetic section for synthesizing one of the two divided third signals and the first audio signal into a first synthetic signal to output to the first loudspeaker; and a second synthetic section for synthesizing the other of the two divided third signals and the second audio signal into a second synthetic signal to output to the second loudspeaker, wherein the input section inputs the first audio signal, the second audio signal, and the third audio signal independent of each other;

the third audio signal has a frequency component that causes a binaural correlation coefficient to become negative at a listening position;

a distance from the listening position to the first loudspeaker is different from a distance from the listening position to the second loudspeaker;

the binaural correlation coefficient indicates a phase difference of the sound waves from the first loudspeaker and the second loudspeaker at both ear positions of a listener at the listening position; and the dividing section sets a phase of one of the two divided third signals and a phase of the other divided third signal so that the binaural correlation coefficient becomes positive at the listening position.

2. An audio synthesizing method for causing a first loudspeaker and a second loudspeaker to produce sound by a first audio signal, a second audio signal and a third audio signal, said first audio signal, second audio signal and third audio signal being supplied from a sound source, said audio synthesizing method comprising:

inputting the first audio signal, the second audio signal and the third audio signal;

dividing the third audio signal into two divided third signals, which have a phase difference mutually in one frequency range;

synthesizing one of the two divided third signals and the first audio signal into a first synthetic signal to output to the first loudspeaker;

synthesizing the other of the two divided third signals and the second audio signal into a second synthetic signal to output the second loudspeaker; and outputting the first synthetic signal and the second synthetic signal;

wherein the first audio signal, the second audio signal, and the third audio signal are input independent of each other, the third audio signal has a frequency component that causes a binaural correlation coefficient to become negative at a listening position;

a distance from the listening position to the first loudspeaker is different from a distance from the listening position to the second loudspeaker;

the binaural correlation coefficient indicates a phase difference of the sound waves from the first loudspeaker and the second loudspeaker at both ear positions of a listener at the listening position; and the dividing step sets a phase of one of the two divided third signals and a phase of the other divided third signal so that the binaural correlation coefficient becomes positive at the listening position.

3. An audio synthesizing system according to claim 1, wherein a range of the frequency component is substantially between 200 Hz and 600 Hz.

4. An audio synthesizing method according to claim 2, wherein a range of the frequency component is substantially between 200 Hz and 600 Hz.

* * * * *